United States Patent
Fujito et al.

(10) Patent No.: US 8,545,626 B2
(45) Date of Patent: Oct. 1, 2013

(54) NITRIDE SEMICONDUCTOR CRYSTAL AND ITS PRODUCTION METHOD

(75) Inventors: Kenji Fujito, Ibaraki (JP); Shuichi Kubo, Ibaraki (JP); Yoko Mashige, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 205 days.

(21) Appl. No.: 12/920,976

(22) PCT Filed: Mar. 2, 2009

(86) PCT No.: PCT/JP2009/053893
§ 371 (c)(1),
(2), (4) Date: Dec. 3, 2010

(87) PCT Pub. No.: WO2009/110436
PCT Pub. Date: Sep. 11, 2009

(65) Prior Publication Data
US 2011/0129669 A1    Jun. 2, 2011

(30) Foreign Application Priority Data

Mar. 3, 2008   (JP) ............................... P2008-052587

(51) Int. Cl.
*C30B 25/02*   (2006.01)
*C30B 25/00*   (2006.01)
*C30B 23/00*   (2006.01)
*C01B 21/06*   (2006.01)

(52) U.S. Cl.
CPC ................. *C30B 25/00* (2013.01); *C30B 23/00* (2013.01); *C30B 25/02* (2013.01); *C01B 21/06* (2013.01)

USPC .............................. 117/89; 117/88; 423/106

(58) Field of Classification Search
CPC ....................................................... C30B 25/00
USPC ............ 117/88, 101, 89; 428/402; 423/406
See application file for complete search history.

(56) References Cited

U.S. PATENT DOCUMENTS

| 3,591,348 A | 7/1971 | La Belle, Jr. |
| 2002/0028564 A1* | 3/2002 | Motoki et al. ................ 438/460 |

(Continued)

FOREIGN PATENT DOCUMENTS

| EP | 2 154 272 A1 | 2/2010 |
| JP | 54 088884 | 7/1979 |

(Continued)

OTHER PUBLICATIONS

U.S. Appl. No. 13/309,138, filed Dec. 1, 2011, Kubo, et al.

(Continued)

*Primary Examiner* — Michael Kornakov
*Assistant Examiner* — Hua Qi
(74) *Attorney, Agent, or Firm* — Oblon, Spivak, McClelland, Maier & Neustadt, L.L.P.

(57) ABSTRACT

A method for efficiently producing a plate-like nitride semiconductor crystal having the desired principal plane in a simple method is provided. A raw material gas is fed to a seed crystal in which a ratio (L/W) of length L in a longitudinal direction and maximum width W, of a plane of projection obtained by projecting a crystal growth face on the seed crystal in a growth direction is from 2 to 400, and the maximum width W is 5 mm or less, thereby growing a plate-like semiconductor crystal on the seed crystal.

19 Claims, 4 Drawing Sheets

(56) References Cited

U.S. PATENT DOCUMENTS

| | | | |
|---|---|---|---|
| 2002/0170484 A1* | 11/2002 | Katamine et al. | 117/4 |
| 2003/0183158 A1 | 10/2003 | Maruska et al. | |
| 2003/0230235 A1* | 12/2003 | Craven et al. | 117/103 |
| 2005/0245095 A1* | 11/2005 | Haskell et al. | 438/767 |
| 2006/0011135 A1 | 1/2006 | Dmitriev et al. | |
| 2006/0128124 A1 | 6/2006 | Haskell et al. | |
| 2006/0228870 A1 | 10/2006 | Oshima | |
| 2007/0032046 A1 | 2/2007 | Dmitriev et al. | |
| 2007/0114566 A1 | 5/2007 | Maruska et al. | |
| 2007/0126023 A1 | 6/2007 | Haskell et al. | |
| 2009/0081857 A1* | 3/2009 | Hanser et al. | 438/507 |
| 2009/0130781 A1 | 5/2009 | Dmitriev et al. | |
| 2010/0148212 A1* | 6/2010 | Fujito et al. | 257/103 |
| 2010/0200865 A1 | 8/2010 | Fujito et al. | |
| 2010/0242835 A1 | 9/2010 | Arena et al. | |
| 2011/0278585 A1 | 11/2011 | Haskell et al. | |
| 2012/0074425 A1 | 3/2012 | Haskell et al. | |

FOREIGN PATENT DOCUMENTS

| | | |
|---|---|---|
| JP | 10 335750 | 12/1998 |
| JP | 2001 064098 | 3/2001 |
| JP | 2002 029897 | 1/2002 |
| JP | 2002-261026 A | 9/2002 |
| JP | 2002 338395 | 11/2002 |
| JP | 2005 247625 | 9/2005 |
| JP | 2006 124268 | 5/2006 |
| JP | 2006 240988 | 9/2006 |
| JP | 2006 290677 | 10/2006 |
| JP | 2006 315947 | 11/2006 |
| JP | 2007 314357 | 12/2007 |
| JP | 2008 091837 | 4/2008 |
| JP | 2008091837 A * | 4/2008 |
| JP | 2009 046377 | 3/2009 |
| WO | WO 00/70129 A1 | 11/2000 |
| WO | 03 035945 | 5/2003 |
| WO | WO 03035945 A2 * | 5/2003 |
| WO | WO 2007/143743 A2 | 12/2007 |
| WO | WO 2007/143743 A3 | 12/2007 |
| WO | WO 2009/035648 A1 | 3/2009 |

OTHER PUBLICATIONS

U.S. Appl. No. 13/571,782, filed Aug. 10, 2012, Fujito, et al.

"Leading Trends," Nikkei Electronics, pp. 65-70, (Aug. 14, 2006).

Fujito, K., et al., "High-quality nonpolar $m$-plane GaN substrates grown by HVPE," Physica Status Solidi (a), vol. 205, No. 5, pp. 1056-1059, (Apr. 23, 2008).

International Search Report issued Jun. 2, 2009 in PCT/JP09/053893 filed Mar. 2, 2009.

Extended European Search Report issued Oct. 25, 2012 in Patent Application No. 09717726.5.

Office Action issued May 7, 2013, in Japanese Application No. 2009-047694 (with English-language Translation).

* cited by examiner

NITRIDE SEMICONDUCTOR CRYSTAL AND ITS PRODUCTION METHOD

TECHNICAL FIELD

The present invention relates to a nitride semiconductor crystal and its production method. According to the production method of the present invention, a plate-like nitride semiconductor crystal can be obtained in a simple operation, and particularly, a large area nitride semiconductor crystal having a non-polar face as a principal plane can be obtained.

BACKGROUND ART

A nitride semiconductor represented by gallium nitride (GaN) has large band gap, and interband transition is a direct transition. Therefore, the nitride semiconductor is a promising material as a substrate of light emitting elements at relatively short wavelength side such as ultraviolet, blue or green light emitting diode, and semiconductor devices such as an electronic device.

The most common nitride semiconductor substrate at present is a substrate having C-plane as a principal plane. However, InGaN blue and green LED and LD, using a GaN substrate having C-plane as a principal plane had the problem that piezoelectric field is generated in c-axis direction which is its growth axis. The piezoelectric field is generated due to that crystal structure of InGaN layer strains and piezoelectric polarization is generated. Due to the polarization, holes and electrons, injected in a light emitting layer are separated, and recombination probability contributing to emission is decreased. Consequently, internal quantum efficiency is decreased, leading to decrease in external quantum efficiency of light emitting devices. To weaken influence of the piezoelectric field, studies on InGaN blue and green LED and LD in which non-polar faces called A-plane and M-plane vertical to C-plane of GaN crystal are growth faces are becoming active (Non-Patent Document 1).

A nitride semiconductor has high melting point, and has high dissociation pressure of nitrogen in the vicinity of the melting point. Therefore, bulk growth from a melt is difficult. On the other hand, it is known that a nitride semiconductor substrate can be produced by using a vapor phase epitaxial method such as a hydride vapor phase epitaxial method (HVPE method) or a metalorganic chemical vapor deposition method (MOCVD method). In this case, a nitride semiconductor crystal can be grown on a surface of a seed crystal by providing the seed crystal on a support and then feeding a raw material gas (see, for example, Patent Document 1). The nitride semiconductor crystal grown on the seed crystal is separated from the support together with the seed crystal, and as necessary, the seed crystal can be recovered by removing with a method such as polishing.

Patent Document 1: JP-A 2006-240988
Non-Patent Document 1: Nikkei Electronics, Aug. 14, 2006, P 65-P 70

DISCLOSURE OF THE INVENTION

Problems that the Invention is to Solve

However, when a plate-like nitride semiconductor substrate having the desired principal plane is tried to produce by this method, the production faces the problem that inefficient steps must be passed. For example, when a relatively large plate-like nitride semiconductor substrate having a non-polar face as a principal plane is tried to produce, a substrate having a relatively large non-polar face as a principal plane is not present as a base substrate. This requires that a non-polar face is grown as a growth face on a different kind of a base substrate such as R-plane sapphire substrate or M-plane silicon carbide (SiC) substrate, and the base substrate is then separated to obtain a substrate; alternatively a crystal is once grown on a polar face of a seed crystal in a direction vertical to the polar face, and then sliced to expose the desired non-polar face. In the case of the former, because of the growth on a different kind of a base substrate, many stacking faults occur in the crystal, and high quality crystal is not obtained. In the case of the latter, high quality crystal free of stacking fault is obtained. However, crystal far larger than the desired plate-like crystal is required to grow on a seed crystal, and additionally, a slicing step is unavoidable. Furthermore, there is a case that growing into such large crystal is extremely difficult, and there was the limit to obtain the desired nitride semiconductor crystal by this method.

Accordingly, to solve the problems in the prior art, the present inventors have made investigations as an object of the present invention that a plate-like nitride semiconductor crystal can efficiently be provided. In particular, investigations have been made as an object to provide a method for producing a plate-like nitride semiconductor crystal that can produce a nitride semiconductor substrate in a simple method without passing through a slicing step. Furthermore, investigations have particularly been made as an object to provide a method for producing a plate-like nitride semiconductor crystal that can produce a large area nitride semiconductor substrate having a non-polar face as a principal plane in a simple method.

Means for Solving the Problems

As a result of keen investigations, the present inventors have found that the problems can be solved by devising crystal growth face of a seed crystal, and the like. That is, the present inventors have reached to provide the following invention as the means for solving the problems.

[1] A method for producing a nitride semiconductor crystal, the method comprising, as a crystal growth step, growing a nitride semiconductor crystal on a seed crystal by feeding a raw material gas to the seed crystal,
wherein the nitride semiconductor crystal grown on the seed crystal is a plate-like crystal,
a ratio (L/W) of length L in a longitudinal direction to maximum width W, in a plane of projection when projecting a crystal growth face on the seed crystal on which the plate-like crystal is grown, in a growth direction, is from 2 to 400, and the maximum width W is 5 mm or less.
[2] The method for producing a nitride semiconductor crystal according to [1], wherein the crystal growth face of the seed crystal is at least one face selected from the group consisting of +C-plane, {10-1X} plane and {11-2Y} plane, wherein X and Y each independently are an integer other than 0.
[3] The method for producing a nitride semiconductor crystal according to [2], wherein the crystal growth face of the seed crystal is +C-plane, {10-1X} or both of them, and a principal plane of the seed crystal is nearly M-plane.
[4] The method for producing a nitride semiconductor crystal according to [2], wherein the crystal growth face of the seed crystal is +C-plane, {11-2Y} plane or both of them, and a principal plane of the seed crystal is nearly A-plane.
[5] The method for producing a nitride semiconductor crystal according to any one of [2] to [4], wherein the seed crystal has {10-10} plane, {11-2Z} plane, {10-1S} plane or {11-20} plane, wherein Z and S each independently are an integer other than 0.

[6] The method for producing a nitride semiconductor crystal according to [1], the method comprising, as the crystal growth step, growing the plate-like crystal in a direction vertical to the crystal growth face by feeding the raw material gas to the seed crystal, wherein the seed crystal comprises at least a crystal growth face having a first side and a second side that are parallel with each other, a first side face which is a face vertical to the crystal growth face and has the first side of the crystal growth face as one side, and a second side face which is a face vertical to the crystal growth face and has the second side of the crystal growth face as one side, wherein a distance from the first side to second side of the crystal growth face is 5 mm or less, and a ratio (average length/distance) of an average length of the first side and second side of the crystal growth face to the distance from the first side to second side of the crystal growth face is from 2 to 400.

[7] The method for producing a nitride semiconductor crystal according to [6], wherein the first side face of the seed crystal is a non-polar face.

[8] The method for producing a nitride semiconductor crystal according to [6], wherein the seed crystal is a hexagonal crystal in which the crystal growth face is C-plane, and the first side face is M-plane.

[9] The method for producing a nitride semiconductor crystal according to [6], wherein the seed crystal is a hexagonal crystal in which the crystal growth face is C-plane, and the first side face is A-plane.

[10] The method for producing a nitride semiconductor crystal according to any one of [6] to [9], wherein the nitride semiconductor crystal is grown such that a face parallel to the first side face becomes a principal plane by the crystal growth step.

[11] The method for producing a nitride semiconductor crystal according to any one of [1] to [10], wherein at least one kind of the raw material gas is controlled so as to always be fed toward a crystal growth end of the plate-like crystal in the crystal growth step.

[12] The method for producing a nitride semiconductor crystal according to any one of [1] to [11], wherein a distance from a feed opening for feeding the raw material gas to the crystal growth end of the plate-like crystal is controlled to maintain constant.

[13] The method for producing a nitride semiconductor crystal according to [12], wherein the control is conducted while measuring the distance from the feed opening to the crystal growth end.

[14] The method for producing a nitride semiconductor crystal according to any one of [11] to [13], wherein a position of the feed opening for feeding the raw material gas is moved with the passage of growth of the plate-like crystal in the crystal growth step.

[15] The method for producing a nitride semiconductor crystal according to any one of [11] to [14], wherein a direction of the feed opening for feeding the raw material gas is changed with the passage of growth of the plate-like crystal in the crystal growth step.

[16] The method for producing a nitride semiconductor crystal according to any one of [11] to [15], wherein a feed rate of the raw material gas is changed with the passage of growth of the plate-like crystal in the crystal growth step.

[17] The method for producing a nitride semiconductor crystal according to any one of [11] to [16], wherein a position of the seed crystal is moved with the passage of growth of the plate-like crystal in the crystal growth step.

[18] The method for producing a nitride semiconductor crystal according to any one of [1] to [17], wherein the raw material gas is fed from a direction vertical to the crystal growth face of the seed crystal in the crystal growth step.

[19] The method for producing a nitride semiconductor crystal according to any one of [1] to [17], wherein the raw material gas is fed to the seed crystal from each of a space expecting a principal plane of the seed crystal and a space expecting a face facing the principal plane.

[20] The method for producing a nitride semiconductor crystal according to any one of [1] to [19], wherein a shape of the feed opening for feeding the raw material gas is similar to a shape of the crystal growth end.

[21] The method for producing a nitride semiconductor crystal according to any one of [1] to [20], wherein a shape of the feed opening for feeding the raw material gas is a slit-like shape, and a maximum length of the slit-like opening is larger than the length L of the plane of projection of the seed crystal.

[22] The method for producing a nitride semiconductor crystal according to any one of [1] to [21], wherein the seed crystal is placed on a support for determining a position of the seed crystal, and a contact face between the seed crystal and the support is 1 mm or more away from the crystal growth face of the seed crystal.

[23] The method for producing a nitride semiconductor crystal according to any one of [1] to [22], wherein the seed crystal is selected from the group consisting of sapphire, SiC, ZnO and Group III nitride semiconductor.

[24] The method for producing a nitride semiconductor crystal according to any one of [1] to [23], wherein the nitride semiconductor is Group III nitride semiconductor.

[25] The method for producing a nitride semiconductor crystal according to any one of [1] to [24], wherein the nitride semiconductor is GaN semiconductor.

[26] The method for producing a nitride semiconductor crystal according to any one of [1] to [25], wherein a plate-like crystal having an area of the principal plane of 2,500 $mm^2$ or more is grown.

[27] The method for producing a nitride semiconductor crystal according to [26], wherein the principal plane is a non-polar face.

[28] A method for producing a nitride semiconductor crystal without slicing the grown nitride semiconductor crystal, the method comprising growing a nitride semiconductor crystal on the seed crystal by conducting the crystal growth step according to any one of [1] to [27], and separating the grown nitride semiconductor crystal from the seed crystal.

[29] A nitride semiconductor crystal produced by the production method according to any one of [1] to [28].

[30] A plate-like nitride semiconductor crystal having a non-polar face having an area of 2,500 $mm^2$ or more as a principal plane, and having a thickness of 1.5 mm or less.

Advantage of the Invention

According to the method for producing a nitride semiconductor crystal of the present invention, a plate-like nitride semiconductor crystal having the desired principal plane can efficiently be produced in a simple method. In particular, a nitride semiconductor crystal having the desired size and principal plane can easily be produced by combining kind and size of crystal growth face of a seed crystal, and crystal growth conditions.

DESCRIPTION OF REFERENCES NUMERALS AND SIGNS

Figure 1:
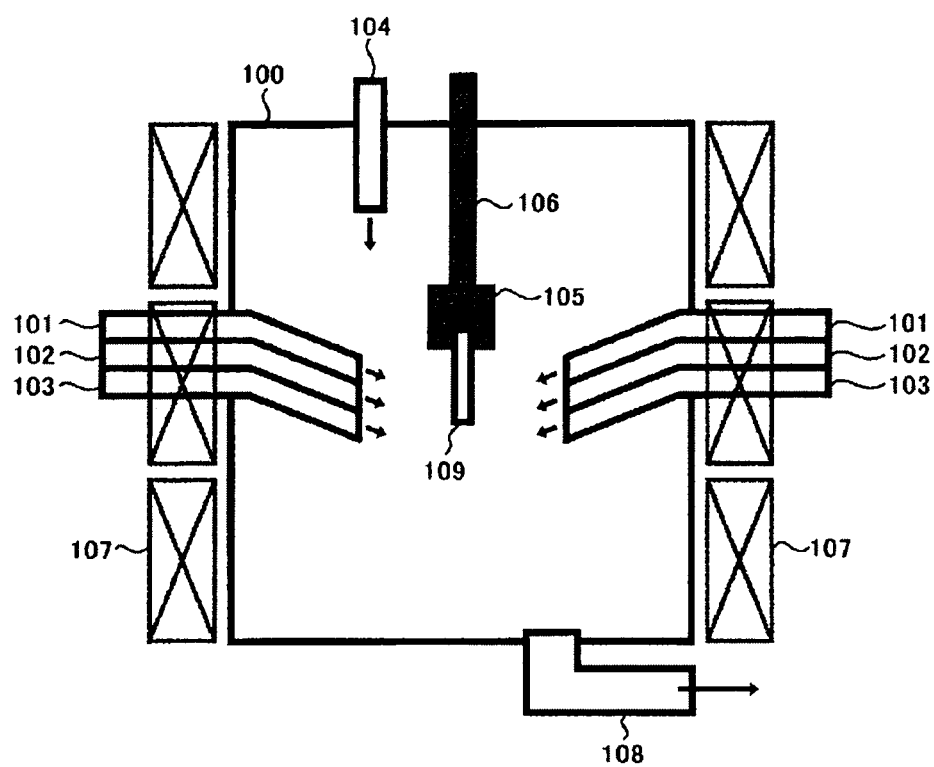
FIG. 1 is a schematically sectional view of HVPE apparatus preferably used in crystal growth of the present invention.

100, 200, 300: Reactor
101, 201: Introduction tube (slit-like nozzle, upper stage)
102, 202: Introduction tube (slit-like nozzle, middle stage)
103, 203: Introduction tube (slit-like nozzle, lower stage)
301, 302, 303: Introduction tube (tubular nozzle)
104, 204, 304: Introduction tube (carrier gas piping)
105, 205, 305: Substrate holder
106, 206, 306: Elevating mechanism
107, 207, 307: Heater
108, 208, 308: Exhaust tube
109, 209, 309, 501: Seed crystal
401: Control mechanism
402: Position detection mechanism of crystal growth end
403: A/D converter
404: CPU (Central Processing Unit)
405: Motor driver
406: Motor
407: Output mechanism
408: Display
409: Printer

BEST MODE FOR CARRYING OUT THE INVENTION

A method for producing a nitride semiconductor crystal of the present invention is described in detail below. The explanation of constituent elements described hereinafter may be made based on the representative embodiment of the present invention, but the present invention is not limited to such an embodiment. Furthermore, in the following description, a nitride gallium crystal is explained as an example of a nitride semiconductor crystal, but the nitride semiconductor crystal that can be used in the present invention is not limited to this. Numerical range represented using "from . . . to" in the present specification means a range including the numerical values described after "from" and after "to" as a lower limit and an upper limit, respectively.

(Seed Crystal)

The seed crystal used in the present invention is characterized in that when a plane of projection when projecting a crystal growth face, on which a plate-like crystal is grown, in a growth direction is assumed, a ratio (L/W) of length L in a longitudinal direction to maximum width W, in the plane of projection is from 2 to 400, and the maximum width W is 5 mm or less.

Kind of the seed crystal is not limited so long as a seed crystal can grow the desired nitride semiconductor crystal on a crystal growth face. Examples of the seed crystal include sapphire, SiC, ZnO and Group III nitride semiconductor. The case of using the same or different kind of a seed crystal of a nitride semiconductor as a nitride semiconductor to be intended to produce is preferred, the case of using a seed crystal of a nitride semiconductor containing at least the same kind of Group III element as Group III element constituting a nitride semiconductor to be intended to produce is more preferred, and the case of using a seed crystal of the same kind of a nitride semiconductor as a nitride semiconductor to be intended to produce is further preferred. From other standpoint, it is preferred to select a seed crystal having a lattice constant close to that of a nitride semiconductor crystal to be intended to produce and having small difference in coefficient of thermal expansion.

The maximum width W on the plane of projection obtained by projecting a crystal growth face in a growth direction is 5 mm or less, preferably from 0.2 mm to 5 mm, more preferably from 0.3 mm to 3 mm, and further preferably from 0.5 mm to 2 mm. The width of the plane of projection may be constant and may not be constant. Preferred case is that the width of the plane of projection is constant, and two facing long sides are parallel with each other. In the case that the width of the plane of projection is constant, its width is the maximum width W of the plane of projection. In the case that the width of the plane of projection is not constant, the largest width is the maximum width W. In the case that the width of the plane of projection is not constant, it is preferred that the width continuously changes in a longitudinal direction, and it is more preferred that the width continuously changes in a longitudinal direction at a constant rate.

The ratio (L/W) of the length L in a longitudinal direction and the maximum width W, on the plane of projection is from 2 to 400, preferably 3 to 270 and more preferably from 5 to 160. In the case that the plane of projection is a rectangle, the length L in a longitudinal direction equals to a long side. In the case that the longest side and the length of the facing side, on the plane of projection differ, an average value of lengths of the two sides is used as the length L in a longitudinal direction.

Thickness of the seed crystal can generally be selected from a range of from 0.1 mm to 50 mm. A range of from 0.5 mm to 20 mm is preferred, and a range of from 1 mm to 10 mm is more preferred.

Plane direction of the plane of projection can include a polar face such as (0001) plane and (000-1) plane; non-polar face such as {1-100} plane and {11-20} plane; and a semi-polar face such as {1-102} plane and {11-22} plane. In the present invention, of those planes, (0001) plane and (000-1) plane are preferred as the plane of projection, and (0001) plane is particularly preferred.

The seed crystal used in the present invention may have and may not have the same plane as the plane of projection as a crystal growth face. For example, in the case that the plane of projection is (0001) plane, a seed crystal having the (0001) plane as a crystal growth face may be used, and a seed crystal having a crystal growth face such that the plane of projection is (0001) plane. The crystal growth face such that the plane of projection is (0001) plane can include {10-1X} plane and {11-2Y} plane, wherein X and Y each independently are an integer other than 0. The seed crystal used in the present invention may have at least two crystal growth faces selected from the group consisting of +C-plane, {10-1X} plane and {11-2Y} plane. In the case of having at least two crystal growth faces, those crystal growth faces must be continuous, and a plane obtained by projecting the whole continuous crystal growth faces in a crystal growth direction is defined as the plane of projection in the present invention.

The principal plane of the seed crystal used in the present invention is preferably a face vertical to the plane of projection. Furthermore, the principal plane of a nitride semiconductor crystal that is desired to produce is preferably a principal plane of the seed crystal. By this, a face having the same plane direction as the principal plane of the seed crystal becomes a principal plane of a plate-like crystal obtained.

The seed crystal particularly preferably used in the present invention is a crystal that the crystal growth face is (0001) plane, {10-1X} plane or both, and the principal plane is nearly {1-100} plane. Another seed crystal particularly preferably used in the present invention is a crystal that the crystal growth face is (0001) plane, {11-2Y} plane or both, and the principal plane is nearly {11-20} plane. The term "nearly" used herein means a plane that off angle is within ±20°. The range of preferred off angle is within ±10°, and the range of more preferred off angle is within ±5°.

Side faces other than the principal plane in the particularly preferred seed crystals of the above two kinds can include {10-10} plane, {11-2Z} plane, {10-1S} plane and {11-20} plane, wherein Z and S each independently are an integer other than 0. Of those, {10-10} plane, {11-2Z} plane and {10-1S} plane are preferred, and {10-10} plane is more preferred.

In the particularly preferred seed crystals of the above two kinds, plane direction of a counter face of the crystal growth face is not particularly limited. The face is generally a face contacting with a substrate holder of a crystal growth apparatus, does not contact with a raw material gas, and therefor can be any face. For example, the face can be (000-1) plane.

When the particularly preferred seed crystals of the above two kinds are used, growth of polycrystal starting from a corner formed between the crystal growth face and the adjacent face can effectively be suppressed. As a result, further uniform and good quality plate-like crystal can efficiently be grown. The fact that further uniform and good quality plate-like crystal is obtained can easily be confirmed by that the crystal obtained does not have an abnormal portion, the crystal does not show coloration, and X-ray diffraction method does not show distribution of crystallizability.

In the present invention, other than the above, seed crystals having various crystal faces can be used. For example, a seed crystal having at least a crystal growth face having a first side and a second side that are parallel with each other, a first side face which is a face vertical to the crystal growth face and having a first side of the crystal growth face as one side, and a second side face which is a face vertical to the crystal growth face and having a second side of the crystal growth face as one side can be used. Herein, it is required that a ratio (average length/distance) of an average length of the first side and the second side to a distance from the first side to the second side is from 2 to 400, and the distance from the first side to the second side is 5 mm or less.

The plane direction of a side face of the seed crystal of this type is not particularly limited so long as the plane direction is vertical to the crystal growth face, and examples thereof can include polar faces such as (0001) plane and (000-1) plane; non-polar faces such as {1-100} plane and {11-20} plane; and semi-polar faces such as {1-102} plane and {11-22} plane. For example, in the case that the crystal growth face is (0001) plane or (000-1) plane, the plane direction of the side face is {1-100} plane or {111-22} plane. In the case that the crystal growth face is {1-100} plane, the side face is (0001) plane, (000-1) plane or {11-20} plane. In the case that the crystal growth face is {11-22} plane, the side face is (0001) plane, (000-1) plane or {1-100} plane. Of the side faces, faces becoming a first side face and a second side face of the seed crystal are faces becoming principal plane of a nitride semiconductor crystal to be grown. Therefore, a seed crystal having the same face as the principal plane of a nitride semiconductor crystal that is desired to produce, as the first side face or the second side face is preferably selected and used in the present invention.

The case that the crystal growth face is (0001) plane or (000-1) plane and the plane direction of the side face is {1-100} plane or {11-20} plane is preferred, the case that the crystal growth face is (0001) plane and the plane direction of the side face is {1-100} plane or {11-20} plane is more preferred, and the case that the crystal growth face is (0001) plane and the plane direction of the side face is {1-100} plane is further preferred.

In the above notation of face, faces that do not have "nearly" may have the respective off angle. The off angel is preferably within ±10° and more preferably within ±5°.

In this specification, the term "C-plane" is a face equivalent to {0001} plane in a hexagonal crystal structure (wurtzite structure). In Groups III to V compound semiconductor crystals, "C-plane" is Group III face, and corresponds to Ga face in gallium nitride. The face equivalent to {0001} plane is (0001) plane or (000-1) plane.

In this specification, {10-10} plane means M-plane, and is a face equivalent to {1-100} plane in a hexagonal crystal structure (wurtzite structure). This is a non-polar face and is generally a cleavage face. The face equivalent to {1-100} plane is (1-100) plane, (−1100) plane, (01-10) plane, (0-110) plane, (10-10) plane and (−1010) plane.

In this specification, {11-20} plane means "A-plane", and is a face equivalent to {11-20} plane in a hexagonal crystal structure (wurtzite structure). This is a non-polar face. A face equivalent to {11-20} plane is (11-20) plane, (−1-120) plane, (1-210) plane, (−12-10) plane, (−2110) plane and (2-1-10) plane.

A seed crystal having the desired face can be obtained by cutting out a crystal as necessary. For example, a seed crystal having M-plane or A-plane as a first side face can be obtained by forming Group III nitride semiconductor substrate having C-plane, and then cutting out such that M-plane or A-plane is exposed. Cutting-out method includes a method of processing (grinding, slicing) with a file, a grinding platen, an inner peripheral blade slicer, a wire-saw and the like; a method of grinding by polishing, and a method of splitting by cleavage. It is preferred to form M-plane or A-plane by cleavage. Regarding the cleavage method, notch may be inserted by a diamond scriber to split a crystal, or a laser scriber apparatus may be used. Alternatively, a crystal may manually be split, and a crystal may be placed on other base, and split by a breaking apparatus.

(Growth Apparatus)

In the present invention, a plate-like crystal is grown in a direction vertical to a plane of projection of a seed crystal by feeding a raw material gas to the seed crystal. The growth method includes MOCVD method and HVPE method. HVPE method having high growth rate is preferred.

FIG. 1 is a view for explaining a constitution example of a production apparatus of a nitride semiconductor crystal used in the present invention, but there is no any specific limitation in the detail of constitution. HVPE apparatus shown in FIG. 1 is equipped with a substrate holder 105 for placing a seed crystal 109, and an elevating mechanism 106 that can rise and fall the substrate holder, in a reactor 100. The apparatus is provided with introduction tubes 101 to 104 for introducing a gas into the reactor 100 and an exhaust tube 108 for exhaustion. The apparatus is further provided with a heater 107 for heating the reactor 100 from a side.

Quartz, sintered born nitride, stainless steel and the like are used as a material of the reactor 100. Preferred material is quartz. Atmosphere gas is previously charged in the reactor 100 before initiation of the reaction. The atmosphere gas (carrier gas) can include an inert gas such as hydrogen, nitrogen, He, Ne or Ar. Those gases may be used as mixtures thereof.

Material of the substrate holder 105 is preferably carbon. The substrate holder surface-coated with SiC is more preferred. Shape of the substrate holder 105 is not particularly limited so long as the shape can hold the seed crystal 109 used in the present invention. However, it is preferred that a structure is not present in the vicinity of a crystal growth face during growing a crystal. Where a structure having a possibility to grow is present in the vicinity of a crystal grow face, a polycrystal is adhered thereto, and HCl gas is generated as its product, and adversely affects a crystal to be grown. Contact face between the seed crystal 109 and the substrate holder 105 separates from a crystal growth face of the seed crystal with a distance of preferably 1 mm or more, more preferably 3 mm or more and further preferably 5 mm or more.

For example, in the case of growing Group III nitride semiconductor, a raw material gas becoming Group III source is fed from an introduction tube 101. In this case, a chloride gas of gallium, aluminum, indium or the like may directly be introduced, and a metal raw material such as gallium, aluminum or indium and a hydrochloric acid gas or the like are reacted in a reactor, and the reaction gas may then be introduced.

In this case, a carrier gas may be fed from an introduction tube 104 together with the raw material gas. The carrier gas can include an inert gas such as hydrogen, nitrogen, He, Ne or Ar. Those gases may be used as mixtures thereof.

A raw material gas becoming a nitrogen source is fed from an introduction tube 103. $NH_3$ is generally fed. A carrier gas is fed from an introduction tube 102. The carrier gas can exemplify the same carrier gases fed from the introduction tube 104. The carrier gas has the effect of separating raw material gas nozzles and preventing adhesion of a polycrystal to the tip of the nozzles. Dopant gas can be fed from the introduction tube 102. For example, n-type dopant gas such as $SiH_4$, $SiH_2Cl_2$ or $H_2S$ can be fed.

The gases fed from the introduction tubes 101 to 104 may be fed from other introduction tubes by exchanging the respective gases with each other. The raw material gas becoming a nitrogen source, and the carrier gas may be mixed and fed from the same introduction tube. Furthermore, the carrier gas may be mixed from other introduction tube. Those feed embodiments can appropriately be determined depending on size and shape of the reactor 100, reactivity of raw materials, the desired crystal growth rate, and the like.

Introduction position and introduction direction of the introduction tubes 101 to 104 are not particularly limited to specific position and direction. For example, introduction from the side, introduction from the bottom, introduction of the top, and introduction of the oblique direction are possible. Embodiment of introducing from a space expecting the principal plane of a seed crystal (for example, a first side face of a seed crystal) and a space expecting a face facing the principal plane (for example, a second face of a seed crystal) toward the respective seed crystals, particularly an embodiment of introducing so as to sandwich the crystal growth face from a right oblique top and a left oblique top of the seed crystal face of the seed crystal as shown in FIG. 1, can be exemplified as the preferred example. In FIG. 1, the introduction tubes 101 to 103 are provided in a superposed state. However, those introduction tubes may be separated and provided, respectively. When the introduction tubes 101 to 103 are provided in a superposed state, there is the advantage that the raw material gases can be separated with the carrier gas, thereby suppressing generation of a polycrystal in the vicinity of a feed opening.

Shape of the feed opening at the tip of the introduction tube is not particularly limited. For example, the shape can be similar to the shape of the crystal growth face of a seed crystal, and similar to the shape of crystal growth end of a crystal grown on the seed crystal. Above all, it is preferred that the shape of feed opening is a slit shape, and the maximum length of the slip opening is larger than the length of the first side and the second side of the seed crystal 109. Specifically, the maximum length is preferably 10 mm or more, more preferably 30 mm or more and further preferably 50 mm or more. The feed opening may comprise a plurality of slits arranged in parallel. Material of the feed opening is preferably quartz, pyrolysis boron nitride (PBN), pyrolysis graphite (PG), SiC and the like, and quart, PBN and PG are more preferred.

A gas exhaust tube 108 can be provided at the top, the bottom and the side of an inner wall of the reactor. The gas exhaust tube 108 is preferably provided at a position lower than the crystal growth end from the standpoint of dust drop, and is more preferably provided at the bottom of the reaction as shown in FIG. 1.

Figure 2:
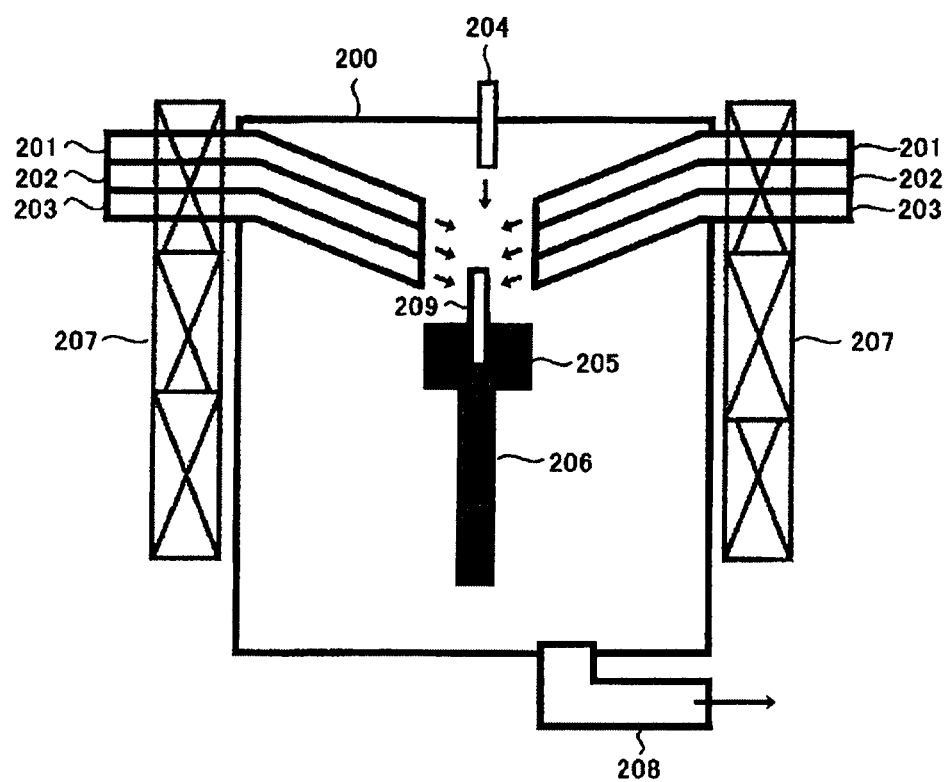
FIG. 2 is a schematically sectional view of another HVPE apparatus preferably used in crystal growth of the present invention.

Apparatus shown in FIG. 2 is exemplified as another example of a growth apparatus. The apparatus shown in FIG. 2 differs from the apparatus shown in FIG. 1 in that a seed crystal 209 can be provided on a substrate holder 205 and can move downward by an elevating mechanism 206. Further difference is that a carrier gas piping 204 is provided just above the seed crystal 209.

Figure 3:
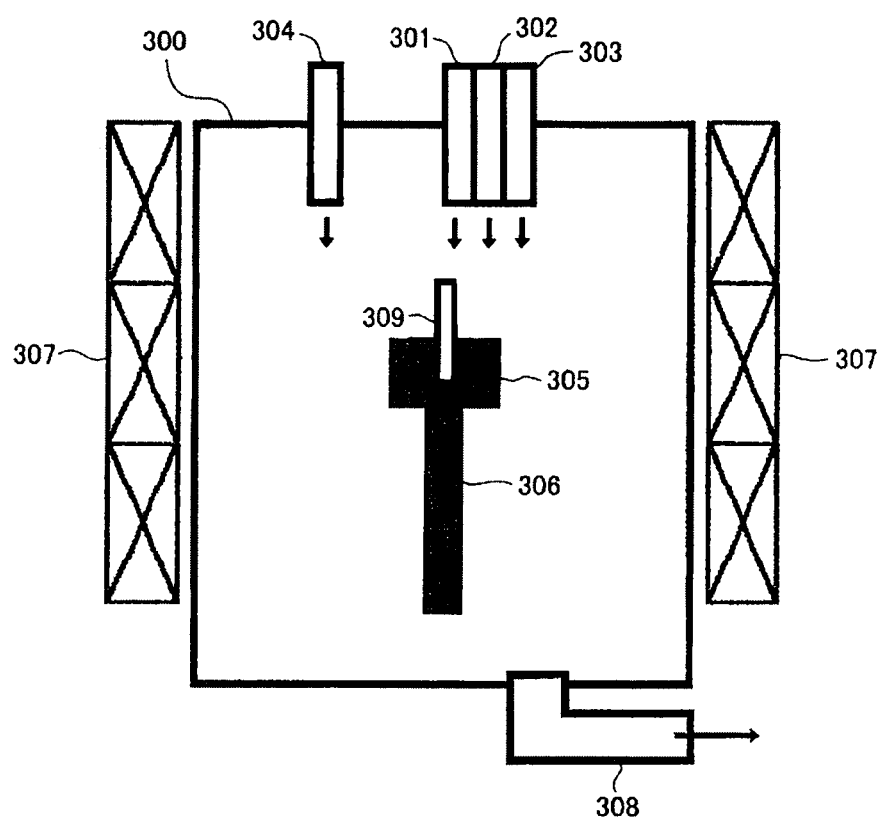
FIG. 3 is a schematically sectional view of still another HVPE apparatus preferably used in crystal growth of the present invention.

Apparatus shown in FIG. 3 is exemplified as still another growth apparatus. The apparatus shown in FIG. 3 differs from the apparatus shown in FIG. 1 in that a seed crystal 309 can be provided on a substrate holder 305 and can move downward by an elevating mechanism 306. Further difference is that introduction tubes 301 to 303 are provided just above the seed crystal 309.

Use of the growth apparatus shown in FIG. 1 has the advantages that influence of particles generated in a gas phase can be reduced, and good crystal free of pit is obtained. Use of the growth apparatuses shown in FIGS. 2 and 3 have the advantages that a driving part such as an elevating mechanism can be provided at the bottom of the apparatus, and this facilitates maintenance.

(Control in Crystal Growth Step)

In the method for producing a nitride semiconductor crystal of the present invention, it is preferred to control so as to always feed at least one kind of raw material gases toward crystal growth end of the plate-like crystal. The term "feeding a raw material gas toward crystal growth end" used herein means feeding a raw material gas toward a direction of crystal growth end. When a seed crystal is provided on a substrate holder fixed according to the conventional method, and nitride semiconductor crystal is grown on the seed crystal, the crystal growth end moves with growth of crystal. It is preferred that a raw material is fed always toward the direction of the crystal growth end, considering this movement portion.

The raw material gas fed toward the crystal growth end is at least one kind of raw material gases used in crystal growth. In the case that only one kind of raw material gases is selected and fed toward the crystal growth end, it is preferred to select a sparingly diffusible raw material gas. For example, when GaN crystal is grown as a nitride semiconductor crystal, $NH_3$ gas and GaCl gas are frequently used as raw material gases. In this case, in the case that only one gas is selected and fed toward the crystal growth end, it is preferred to select GaCl.

The gas that was not selected is ready to be diffused and fed to the crystal growth end by, for example, feeding the gas together with the carrier gas from the top of the reactor.

In the method for producing a nitride semiconductor crystal of the present invention, it is preferred to control so as to maintain a distance from a feed opening for feeding at least one kind of raw material gases to a crystal growth end constant. Where the distance from the feed opening for feeding raw material gas to the crystal growth end is too short, a polycrystal is adhered to the feed opening, and growth cannot be conducted for a long period of time. On the other hand, where the distance is too large, raw material efficiency is decreased, and the desired crystal growth rate is not obtained. For those reasons, the distance from the feed opening to the crystal growth end is preferably from 1 cm to 15 cm, more preferably from 3 cm to 12 cm and further preferably from 5 cm to 10 cm. During the crystal growth step, the distance from the feed opening to the crystal growth end is controlled to preferably ±15 mm, more preferably ±10 mm and further preferably ±5 mm, of the distance at the time of initiation of the growth. Feed rate of the raw material gas from the feed opening is generally from 0.01 m/min to 1 m/min, preferably from 0.05 m/min to 0.7 m/min and more preferably from 0.1 m/min to 0.4 m/min.

In the method for producing a nitride semiconductor crystal of the present invention, a method of controlling at least one kind of raw material gases to always be fed toward crystal growth end of the plate-like crystal is not particularly limited. For example, the raw material gas can be controlled by moving a position of a substrate holder holding a seed substrate and a position of a raw material gas feed opening, with the passage of crystal growth and changing blowing angle of a raw material gas feed opening and a gas feeding rate. Those control methods may be conducted by combining those. The movement and change may be conducted continuously or sequentially. However, it is preferred that the control method is conducted continuously.

A specific control method that can be employed includes a method of fixing a raw material gas feed opening and then moving a position of a substrate holder holding a seed substrate in a direction reverse to a direction of the crystal growth with the passage of crystal growth, and a method of fixing a position of a substrate holder and then moving a position of a raw material gas feed opening in a direction of the crystal growth with the passage of crystal growth. When those methods are employed, it is preferred that the movement rate of the substrate holder and the raw material gas feed opening is the same level as the crystal growth rate. Other control method includes a method of fixing a position of the substrate holder and then changing at least one of a blowing angle of a raw material gas feed opening and a gas feed rate fed from the raw material gas feed opening, with the passage of crystal growth.

To appropriately conduct the position control and angle control, it is necessary to accurately grasp a position of the crystal growth end during the crystal growth step. For this reason, it is preferred that the crystal growth apparatus used in the present invention is equipped with a position detection mechanism of a crystal growth end. The kind of the position detection mechanism of a crystal growth end is not particularly limited so long as the position detection mechanism is equipped with a function that can measure a position of a crystal growth end during a crystal growth step and utilize the result for the control. For example, an image observation apparatus such as CCD (charge coupled device) can preferably be employed. Furthermore, a heat-resistant bore scope or the like may be employed.

Figure 4:
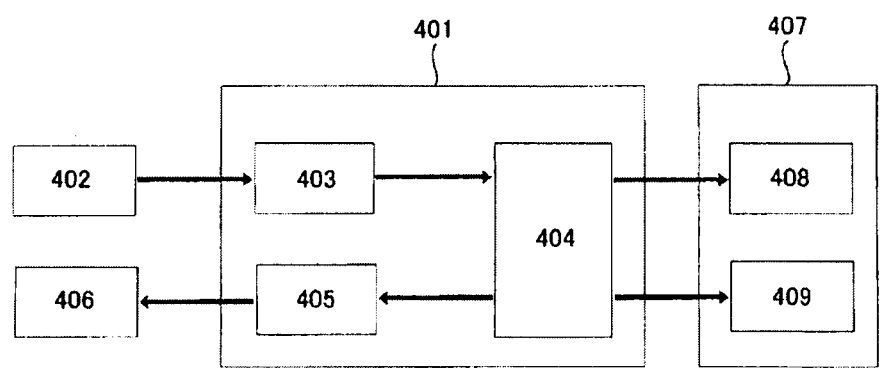
FIG. 4 is a schematic view showing the relationship between control mechanism and output mechanism.

Information of a crystal growth end obtained by the position detection mechanism is preferably processed with a control mechanism. The control mechanism is equipped with a function to issue the order of controlling positions of a substrate holder and a feed opening and a blowing angle of a feed opening, in the crystal growth apparatus according to the position of a crystal growth end. The control mechanism may be combined with an output mechanism for monitoring control situation. Details of the control mechanism and the output mechanism are explained by reference to the mechanism shown in FIG. 4. A control mechanism 401 of FIG. 4 comprises A/D converter, CPU (central processing unit) 404 and a motor driver 405, and an output mechanism 407 comprises a display 408 and a printer 409. Position data (such as coordinate) of a crystal growth end detected by a position detection mechanism 402 of a crystal growth end are converted into digital date by the A/D converter 403, and led into the CPU 404. After conducting appropriate correction with the CPU 404, the data are expressed numerically or in a graph according to an output circuit in an output mechanism 407 to indicate those on a display 408, and those are printed by a printer 409. In the CPU 404, optimum control direction and control amount are calculated according to position information obtained, the order is issued to the motor driver 405, and the motor 406 moving positions of the substrate holder and the raw material gas feed opening is driven. A series of those motions are previously programmed in a computer, and the motions can automatically be practiced by the order of the CPU 404 through the motor driver 405 and the A/D converter 403. In the case that the position detection mechanism 402 of a crystal growth end outputs position information as a digital signal, the A/D converter 403 can be omitted.

If it is possible to nearly accurately predict a position of a crystal growth end during a crystal growth step based on crystal growth rate and the like grasped by experimental rule, it is possible to omit a position detection mechanism of a crystal growth end. Furthermore, the position of the crystal growth end may be predicted and controlled based on those measurement results using a mechanism measuring temperature and pressure in the crystal growth apparatus in place of the position detection mechanism of a crystal growth end. Those modifications can appropriately be conducted within the knowledge of one skilled in the art.

In the case of moving the positions of the substrate holder and the raw material gas feed opening according to the production method of the present invention, the movement distance can be determined depending on a size of a crystal to be produced. In the case of obtaining a large-sized crystal, the movement distance is preferably 10 mm or more, more preferably 20 mm or more and further preferably 50 mm or more.

(Crystal Growth Condition)

Crystal growth in the present invention is generally conducted at from 950° C. to 1,120° C., preferably conducted at from 970° C. to 1,100° C., more preferably conducted at from 980° C. to 1,090° C. and further preferably conducted at 990° C. to 1,080° C. Pressure in the reactor is preferably from 10 kPa to 200 kPa, more preferably from 30 kPa to 150 kPa and further preferably from 50 kPa to 120 kPa.

Growth rate of crystal growth in the present invention varies depending on growth method, growth temperature, raw material gas feed amount, crystal growth face direction and the like, but is generally from 5 µm/h to 500 µm/h, preferably from 10 µm/h to 500 µm/h, more preferably from 50 µm/h to 400 µm/h and further preferably from 100 µm/h to 300 µm/h. The growth rate can be controlled by appropriately setting the kind and flow rate of carrier gas the distance from feed opening to crystal growth end, and the like, in addition to those described above.

(Nitride Semiconductor Crystal)

The nitride semiconductor crystal obtained by the present invention is a plate-like crystal having a side face at the time of growth as a principal plane. The principal plane of the plate-like crystal is generally a face vertical to the plane of projection of a seed crystal. In the case that the principal plane of a seed crystal is vertical to the plane of projection, the principal plane of the plate-like crystal obtained is parallel to the principal plane of a seed crystal. For example, the nitride semiconductor crystal obtained by the present invention using a seed crystal in which the plane of projection is +C-plane and the principal plane is M-plane is a plate-like crystal having M-plane as the principal plane. Furthermore, the nitride semiconductor crystal obtained by the present invention using a seed crystal in which the plane of projection is +C-plane and the principal plane is A-plane is a plate-like crystal having A-plane as the principal plane. According to the production method of the present invention, the principal surface of the plate-like crystal obtained can be a sufficient size. Therefore, the plate-like crystal can be finished as a nitride semiconductor substrate with only grinding and polishing without slicing technique. The term "principal plane" used in the present specification means a face having the maximum area in faces constituting a crystal.

The advantage that the plate-like crystal can be finished as a nitride semiconductor substrate with only grinding and polishing without using slicing technique can effectively be utilized particularly in the case of obtaining a nitride semiconductor substrate having a non-polar face as a principal plane. For example, in the case of trying to produce a nitride semiconductor substrate having M-plane as a principal plane, according to the conventional method, a nitride semiconductor crystal had to be grown on C-plane of a seed crystal in a direction vertical to the C-plane, and the nitride semiconductor crystal obtained had to be sliced in a direction vertical to the C-plane, thereby exposing M-plane. This method has the defects that the number of steps is large, and considerably large nitride semiconductor crystal must be grown. On the other hand, according to the production method of the present invention, the number of steps can be reduced because of unnecessity of slicing, and it is sufficient to only grow a crystal having a size slightly larger than a size of a substrate to be required. Therefore, according to the present invention, the desired nitride semiconductor substrate can efficiently be obtained. For example, a plate-like nitride semiconductor crystal having a non-polar face as a principal plane and a thickness of 1.5 mm or less can preferably be provided.

According to the present invention, a plate-like nitride semiconductor substrate having a large area of a principal plane can easily be obtained. The area of the principal plane can appropriately be adjusted by a size of a crystal growth face of a seed crystal and crystal growth time. According to the present invention, for example, the area of the principal plane can make 2,500 mm$^2$ or more, can make 5,700 mm$^2$ or more, and further can make 10,000 mm$^2$ or more.

Kind of the nitride semiconductor crystal provided by the present invention is not particularly limited. Specifically, Group III nitride semiconductor crystal can be exemplified. More specifically, gallium nitride, aluminum nitride, indium nitride and those crystals can be exemplified.

The nitride semiconductor crystal obtained by the production method of the present invention can be used in various applications. In particular, the nitride semiconductor crystal is useful as substrates of light emitting elements at relatively short wavelength side, such as ultraviolet, blue or green light emitting diodes and semiconductor lasers, and semiconductor devices such as electronic devices. Furthermore, the nitride semiconductor crystal produced by the production method of the present invention is used as a base substrate, and larger nitride semiconductor crystal can be obtained.

EXAMPLES

The characteristics of the present invention are further specifically described below by referring to Examples and Comparative Examples. Material, amount used, proportion, processing content, processing procedure and the like shown in the following Examples can appropriately be modified so long as it does not exceed the gist of the present invention. Therefore, the scope of the present invention should not limitedly be construed by the following specific examples.

Example 1

In this example, growth of a nitride semiconductor crystal was conducted using the HVPE apparatus shown in FIG. 2. The HVPE apparatus of FIG. 2 is equipped with slit-like nozzles in three stages, and a size of a first stage nozzle of a raw material feed opening is a width of 20 mm and a height of 2 mm, and is made of PBN.

GaN seed crystal 209 having M-plane as a principal plane was provided. This seed crystal is a crystal obtained by slicing a crystal prepared on C-plane GaN template with HVPE method, and is a rectangular solid having a length in a-axis direction of about 20.0 mm, a length in c-axis direction of about 8 mm and a length in m-axis direction of about 1 mm.

The seed crystal was set to a substrate holder 205 in a reactor 200 of the HVPE apparatus such that +C-plane is upward and a longitudinal direction of slit blowing opening is parallel to a-axis direction of the seed crystal. Temperature of the reactor was increased to 1,040° C., and a raw material was fed on +C-plane, thereby growing undoped GaN on the +C-plane. In this growth step, growth pressure was $1.01 \times 10^5$ Pa, partial pressure of NH$_3$ gas introduced from the upper stage of slit-like nozzles was $7 \times 10^3$ Pa, partial pressure of N$_2$ gas introduced from a middle stage thereof was $3 \times 10^2$ Pa, and partial pressure of GaCl gas introduced from the lower stage thereof was $3 \times 10^2$ Pa. H$_2$ gas was introduced as a carrier gas from 204.

After growing for 50 hours, temperature was decreased to room temperature, and GaN single crystal having a square-shaped side face (M-plane) having about 22.0 mm long and about 22.0 mm wide, and having a thickness in m-axis direction of about 1 mm was obtained. Area of a principal plane (M-plane) was 484.0 mm$^2$, and area of a growth face (+C-plane) was 22.0 mm$^2$.

The GaN single crystal was polished and shape-adjusted. Thus, a self-standing substrate having 20.0 mm long, 20.0 mm wide and a thickness of 350 μm and having a square-shaped M-plane as a principal plane was obtained.

Comparative Example 1

2-inch GaN template substrate was provided by using a sapphire substrate having a diameter of 2 inches and a thickness of 430 μm as a base substrate, and growing 2 μm (0001) plane GaN thereon by MOCVD method. The substrate was provided in a reactor apparatus of HVPE apparatus, and growth temperature was increased to 1,040° C. A GaN layer was then grown on the base GaN layer over about 40 hours while feeding a carrier gas substantially consisting of H$_2$ only, GaCl gas that is a reaction product between Ga and HCl, and NH$_3$ gas. In this growth step, growth pressure was $1.01 \times 10^5$ Pa, partial pressure of GaCl gas was $3.07 \times 10^2$ Pa, and partial pressure of NH$_3$ gas was $1.27 \times 10^4$ Pa. After completion of the growth, temperature was decreased to room temperature. Thus, GaN single crystal having a thickness of about 5 mm was obtained.

Slicing was conducted using a wire-saw type apparatus. Distance of each wire is 700 μm, and slicing rate is 1 mm/h. Diameter of the wire was appropriately selected in a range of from 0.1 to 0.2 mm. A plurality of M-plane GaN substrates were obtained by slicing vertical to C-plane of a crystal and parallel to M-plane thereof. The GaN substrate obtained was a rectangular shape having a size of a short side of about 5 mm and a long side of from about 10 to 30 mm.

Example 2

In this example, growth of a nitride semiconductor crystal was conducted using the HVPE apparatus shown in FIG. 3.

GaN seed crystal 309 having M-plane as a principal plane was provided. This seed crystal is a crystal obtained by slicing a crystal prepared on C-plane GaN template with HVPE method, and is a rectangular solid having a length in a-axis direction of about 20.0 mm, a length in c-axis direction of about 5.0 mm and a length in m-axis direction of about 0.3 mm.

The seed crystal was set to a substrate holder 305 in a reactor 300 of the HVPE apparatus such that +C-plane was upward. In this case, the −C-plane contacts with the substrate holder 305 and does not directly contact with a raw material gas.

Temperature of the reactor was increased to 1,040° C., and raw material was fed from +C-plane direction, thereby growing undoped GaN. In this growth step, growth pressure was $1.01 \times 10^5$ Pa, partial pressure of NH$_3$ gas was $7.03 \times 10^3$ Pa, partial pressure of N$_2$ gas was $1.79 \times 10^4$ Pa, partial pressure of GaCl gas was $7.37 \times 10^2$ Pa, and partial pressure of H$_2$ gas was $7.53 \times 10^4$ Pa.

After growing for 40 hours, temperature was decreased to room temperature. GaN single crystal obtained had a plate-like shape having a length in a-axis direction of about 22.0 mm, a length in c-axis direction of about 12.5 mm and a thickness in m-axis direction of about 1.4 mm. Area of a principal plane (M-plane) was 275.0 mm$^2$.

The GaN single crystal was polished and shape-adjusted. Thus, a self-supporting substrate having a length in a-axis direction of 20.0 mm, a length in c-axis direction of 11.0 mm and a thickness of 330 μm and having a rectangle-shaped M-plane as a principal plane was obtained.

Example 3

In this example, Example 2 was followed, except for using a rectangular solid-shaped crystal having a length in a-axis direction of about 20.0 mm, a length in c-axis direction of about 4.2 mm and a length in m-axis direction of about 4.5 mm as the GaN seed crystal.

After growing for 40 hours, temperature was decreased to room temperature. GaN single crystal obtained had a plate-like shape having a length in a-axis direction of about 22.0 mm, a length in c-axis direction of about 11.0 mm and a thickness in m-axis direction of about 5.6 mm. Area of a principal plane (M-plane) was 187.0 mm$^2$.

The GaN single crystal was sliced, polished and shape-adjusted. Thus, five self-standing substrates each having a length in a-axis direction of 20.0 mm, a length in c-axis direction of 10.0 mm and a thickness of 330 μm and having a rectangle-shaped M-plane as a principal plane were obtained.

Comparative Example 2

In this comparative example, Example 2 was followed, except for using a rectangular solid-shaped crystal having a length in a-axis direction of about 20.0 mm, a length in c-axis direction of about 0.4 mm and a length in m-axis direction of about 7.0 mm as the GaN seed crystal.

Figure 5:
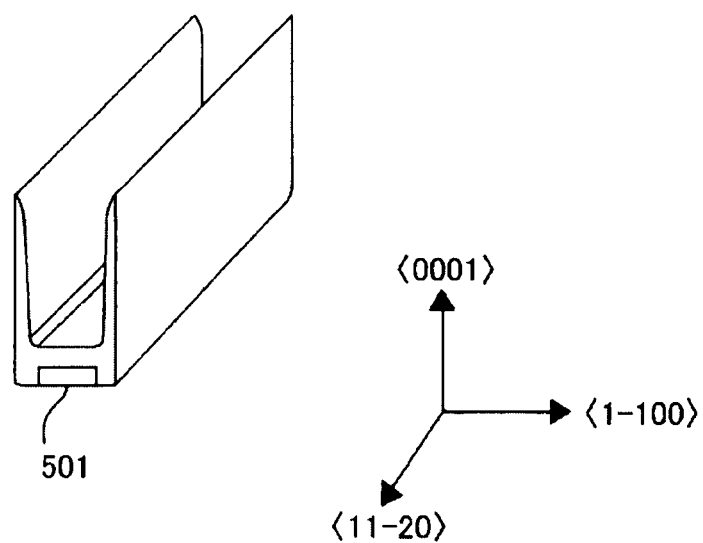
FIG. 5 is a perspective view schematically showing a state that crystal was grown on a seed crystal in Comparative Example 2.

After growing for 40 hours, temperature was decreased to room temperature. The GaN single crystal obtained did not have a plate-like shape, and had a shape in which two walls grown in +c-axis direction were formed as shown in FIG. 5. Length in a-axis direction was about 20.0 mm, the maximum length in c-axis direction was about 10.0 mm, and the minimum length thereof was about 5.2 mm. Thus, the length in c-axis direction was not uniform and was irregular. Furthermore, a thickness in m-axis direction of one wall was about 0.8 mm.

Example 4

GaN seed crystal having M-plane ((10-10) plane) as a principal plane and having side faces comprising 4 planes of +C-plane, (−1-122) plane, −C-plane and (11-22) plane was provided. This seed crystal has a length in c-axis direction of about 5 mm, a length in a-axis direction of from about 15 mm to 18 mm and a length in m-axis direction of about 2 mm.

The seed crystal was set to a substrate holder in a reactor of the HVPE apparatus shown in FIG. 3 such that +C-plane is upward. In this case, the −C-plane contacts with the substrate holder and does not directly contact with a raw material gas. Temperature of the reactor was increased to 1,040° C., and raw material was fed from +C-plane direction, thereby growing undoped GaN. In this growth step, growth pressure was $1.01 \times 10^5$ Pa, partial pressure of NH$_3$ gas was $7.03 \times 10^3$ Pa, partial pressure of N$_2$ gas was $1.79 \times 10^4$ Pa, partial pressure of GaCl gas was $7.37 \times 10^2$ Pa, and partial pressure of H$_2$ gas was $7.53 \times 10^4$ Pa.

After growing for 40 hours, temperature was decreased to room temperature. GaN single crystal obtained did not have abnormal growth at corners, and a homogeneous plate-like crystal was obtained. Length in c-axis direction after growing was about 15 mm.

The GaN single crystal was sliced, polished and shape-adjusted. Thus, a plurality of homogeneous self-standing substrates each having 15 mm square and a thickness of 330 μm and having M-plane as a principal plane were obtained.

Example 5

GaN seed crystal having M-plane ((10-10) plane) as a principal plane and having side faces comprising 4 planes of +C-plane, (1-100) plane, −C-plane and (01-10) plane was provided. This seed crystal has a length in c-axis direction of about 5 mm, a length in a-axis direction of from about 15 mm to 18 mm and a length in m-axis direction of about 2 mm.

After growing for 40 hours in the same manner as in Example 4, temperature was decreased to room temperature. The GaN single crystal obtained did not have abnormal growth at corners, and a homogeneous plate-like crystal was obtained. The plate-like crystals of Example 4 and Example 5 were further excellent in this point as compared with plate-like crystals of other Examples. Length in c-axis direction after growing of Example 5 was about 15 mm.

The GaN single crystal was polished and shape-adjusted. Thus, a homogeneous self-standing substrate having 15 mm square and a thickness of 330 μm and having M-plane as a principal plane was obtained.

Example 6

GaN seed crystal having M-plane as a principal plane and having side faces comprising 4 planes of +C-plane, A-plane, −C-plane and A-plane was provided. This seed crystal was a rectangular solid having a length in c-axis direction of about 5 mm, a length in a-axis direction of about 15 mm and a length in m-axis direction of about 2 mm.

After growing for 40 hours in the same manner as in Example 4, temperature was decreased to room temperature. The GaN single crystal obtained was polished and shape-adjusted. Thus, a self-standing substrate having M-plane as a principal plane was obtained.

Example 7

In this example, GaN crystal growth is conducted using HVPE apparatus in which CCD and a substrate holder elevating mechanism were further provided in the apparatus shown in FIG. 2. CCD is provided such that a position of crystal growth end moving with the passage of crystal growth can accurately be measured. Position information of crystal growth end measured by CCD is processed according to the control mechanism of FIG. 4, and is previously set so as to drive the substrate holder elevating mechanism such that the position of crystal growth end always locates at the same position during the crystal growth step. That is, it is set such that when it is detected that a crystal grows and the crystal growth end has moved to the upper part of the drawing, the substrate holder moves to the lower part of the drawing to the same extent as the movement of the crystal growth end. GaN crystal growth is conducted under the same conditions as in Example 1 except for using the above HVPE apparatus.

As a result, a self-standing substrate having the same size as in Example 1 and having M-plane as a principal plane is obtained. As compared with Example 1, growth rate is fast, and crystal growth is observed further uniformly over the entire crystal growth face.

Example 8

In this example, GaN crystal growth is conducted using HVPE apparatus in which CCD and a substrate holder elevating mechanism were further provided in the apparatus shown in FIG. 2. CCD is provided such that a position of crystal growth end moving with the passage of crystal growth can accurately be measured. Position information of crystal growth end measured by CCD is processed according to the control mechanism of FIG. 4, and is previously set so as to drive the nozzle elevating mechanism such that the positional relationship between the crystal growth end and a feed opening of a nozzle is always the same during the crystal growth step. That is, it is set such that when it is detected that crystal grows and the crystal growth end has moved to the upper part of the drawing, the feed opening of nozzle moves to the upper part of the drawing to the same extent as the movement of the crystal growth end. GaN crystal growth is conducted under the same conditions as in Example 1 except for using the above HVPE apparatus.

As a result, a self-standing substrate having the same size as in Example 1 and having M-plane as a principal plane is obtained. As compared with Example 1, growth rate is fast, and crystal growth is observed further uniformly over the entire crystal growth face.

Example 9

In this example, GaN crystal growth is conducted using HVPE apparatus in which CCD and a substrate holder elevating mechanism were further provided in the apparatus shown in FIG. 2. CCD is provided such that a position of crystal growth end moving with the passage of crystal growth can accurately be measured. Position information of crystal growth end measured by CCD is processed according to the control mechanism of FIG. 4, and is previously set so as to control a direction (angle) of a nozzle feed opening such that a raw material gas is always fed toward the crystal growth end during the crystal growth step. That is, it is set such that when it is detected that crystal grows and the crystal growth end has moved to the upper part of the drawing, the feed opening of a nozzle faces upward. GaN crystal growth is conducted under the same conditions as in Example 1 except for using the HVPE apparatus.

As a result, a self-standing substrate having the same size as in Example 1 and having M-plane as a principal plane is obtained. As compared with Example 1, growth rate is fast, and crystal growth is observed further uniformly over the entire crystal growth face.

Example 10

In this example, growth of a nitride semiconductor crystal is conducted using the HVPE apparatus shown in FIG. 1. The HVPE apparatus of FIG. 1 is equipped with slit-like nozzles in three stages, and a size of a first stage nozzle of a raw material feed opening is a width of 20 mm and a height of 2 mm, and is made of PBN.

The same GaN seed crystal 109 as used in Example 1 is provided, and is set to a substrate holder 105 in a reactor 100 of the HVPE apparatus such that +C-plane is downward and a longitudinal direction of slit blowing opening is parallel to a-axis direction of the seed crystal. Temperature of the reactor is increased to 1,040° C., and a raw material is fed on +C-plane, thereby growing undoped GaN on the +C-plane. In this growth step, growth pressure was $1.01 \times 10^5$ Pa, partial pressure of $NH_3$ gas introduced from the upper stage of slit-like nozzles was $7 \times 10^3$ Pa, partial pressure of $N_2$ gas introduced from a middle stage thereof was $3 \times 10^2$ Pa, and partial pressure of GaCl gas introduced from the lower stage thereof was $3 \times 10^2$ Pa. $H_2$ gas is introduced as a carrier gas from 104.

After growing for 50 hours, temperature is decreased to room temperature, and the same crystal as in Example 1 is obtained. The GaN single crystal is polished and shape-adjusted. Thus, a self-standing substrate having a square-shaped M-plane as a principal plane is obtained.

Example 11

In this example, GaN crystal growth is conducted using HVPE apparatus in which CCD and a substrate holder elevating mechanism were further provided in the apparatus shown in FIG. 1. CCD is provided such that a position of crystal growth end moving with the passage of crystal growth can accurately be measured. Position information of crystal growth end measured by CCD is processed according to the control mechanism of FIG. 4, and is previously set so as to drive the substrate holder elevating mechanism such that the position of the crystal growth end is always the same position during the crystal growth step. That is, it is set such that when it is detected that crystal grows and the crystal growth end has moved to the lower part of the drawing, the substrate holder moves to the upper part of the drawing to the same extent as the movement of the crystal growth end. GaN crystal growth is conducted under the same conditions as in Example 10 except for using the above HVPE apparatus.

As a result, a self-standing substrate having the same size as in Example 10 and having M-plane as a principal plane is obtained. As compared with Example 5, growth rate is fast, and crystal growth is observed further uniformly over the entire crystal growth face.

Example 12

In this example, GaN crystal growth is conducted using HVPE apparatus in which CCD and a substrate holder elevating mechanism were further provided in the apparatus shown in FIG. 1. CCD is provided such that a position of crystal growth end moving with the passage of crystal growth can accurately be measured. Position information of crystal growth end measured by CCD is processed according to the control mechanism of FIG. 4, and is previously set so as to drive the nozzle elevating mechanism such that the positional relationship between the crystal growth end and a feed opening of a nozzle is always the same during the crystal growth step. That is, it is set such that when it is detected that crystal grows and the crystal growth end has moved to the lower part of the drawing, the feed opening of a nozzle moves to the lower part of the drawing to the same extent as the movement of the crystal growth end. GaN crystal growth is conducted under the same conditions as in Example 10 except for using the above HVPE apparatus.

As a result, a self-standing substrate having the same size as in Example 10 and having M-plane as a principal plane is obtained. As compared with Example 10, growth rate is fast, and crystal growth is observed further uniformly over the entire crystal growth face.

Example 13

In this example, GaN crystal growth is conducted using HVPE apparatus in which CCD and a substrate holder elevating mechanism were further provided in the apparatus shown in FIG. 1. CCD is provided such that a position of crystal growth end moving with the passage of crystal growth can accurately be measured. Position information of crystal growth end measured by CCD is processed according to the control mechanism of FIG. 4, and is previously set so as to control a direction (angle) of a nozzle feed opening such that a raw material gas is always fed toward the crystal growth end during the crystal growth step. That is, it is set such that when it is detected that crystal grows and the crystal growth end has moved to the lower part of the drawing, the feed opening of a nozzle faces downward. GaN crystal growth is conducted under the same conditions as in Example 10 except for using the above HVPE apparatus.

As a result, a self-standing substrate having the same size as in Example 10 and having M-plane as a principal plane is obtained. As compared with Example 10, growth rate is fast, and crystal growth is observed further uniformly over the entire crystal growth face.

Although the present invention has been described in detail and by reference to the specific embodiments, it is apparent to one skilled in the art that various modifications or changes can be made without departing the spirit and scope of the present invention.

This application is based on Japanese Patent Application No. 2008-052587 filed on Mar. 3, 2008, the contents of which is incorporated herein by reference in its entity.

INDUSTRIAL APPLICABILITY

According to the method for producing a nitride semiconductor crystal of the present invention, the desired plate-like nitride semiconductor crystal can efficiently be produced in a simple method. In particular, a large area nitride semiconductor substrate having a non-polar face as a principal plane can be produced in a simple method. Therefore, according to the present invention, production cost and work can be reduced, and additionally, a new nitride semiconductor crystal that could not conventionally been produced can be provided. Therefore, the present invention has high industrial applicability.

The invention claimed is:

1. A method for producing a nitride semiconductor crystal, the method comprising:
    feeding a raw material gas to a seed crystal; and
    growing a nitride semiconductor crystal vertically to a growth face of the seed crystal;
    wherein
    the growth face of the seed crystal is a non-principal plane of the seed crystal,
    the nitride semiconductor crystal grown on the seed crystal is a plate-like crystal,
    the seed crystal comprises at least a crystal growth face having a first side and a second side that are parallel with each other, a first side face which is a face vertical to the crystal growth face and has the first side of the crystal growth face as one side, and a second side face which is a face vertical to the crystal growth face and has the second side of the crystal growth face as one side, wherein a distance from the first side to second side of the crystal growth face is 5 mm or less, and
    a ratio of average length/distance is from 2 to 400,
    wherein the average length is an average value of a length of the first side and a length of the second side of the crystal growth face, and
    the distance is the value of the distance from the first side to the second side of the crystal growth face.

2. The method for producing a nitride semiconductor crystal according to claim 1, wherein the crystal growth face of the seed crystal is at least one face selected from the group consisting of +C-plane, {10-1X} plane and {11-2Y} plane, wherein X and Y each independently are an integer other than 0.

3. The method for producing a nitride semiconductor crystal according to claim 1, wherein the first side face of the seed crystal is a non-polar face.

4. The method for producing a nitride semiconductor crystal according to claim 1, wherein the seed crystal is a hexagonal crystal in which the crystal growth face is C-plane, and the first side face is M-plane.

5. The method for producing a nitride semiconductor crystal according to claim 1, wherein the seed crystal is a hexagonal crystal in which the crystal growth face is C-plane, and the first side face is A-plane.

6. The method for producing a nitride semiconductor crystal according to claim 1, wherein the nitride semiconductor crystal is grown such that a face parallel to the first side face becomes a principal plane by the crystal growth.

7. The method for producing a nitride semiconductor crystal according to claim 1, wherein at least one kind of the raw material gas is controlled so as to always be fed toward a crystal growth end of the plate-like crystal in the crystal growth.

8. The method for producing a nitride semiconductor crystal according to claim 1, wherein a distance from a feed opening for feeding the raw material gas to the crystal growth end of the plate-like crystal is controlled to maintain constant.

9. The method for producing a nitride semiconductor crystal according to claim 1, wherein the raw material gas is fed from a direction vertical to the crystal growth face of the seed crystal in the crystal growth.

10. The method for producing a nitride semiconductor crystal according to claim 1, wherein the raw material gas is fed to the seed crystal from each of a space expecting a principal plane of the seed crystal and a space expecting a face facing the principal plane.

11. The method for producing a nitride semiconductor crystal according to claim 1, wherein a shape of the feed opening for feeding the raw material gas is similar to a shape of the crystal growth end.

12. The method for producing a nitride semiconductor crystal according to claim 1, wherein a shape of the feed opening for feeding the raw material gas is a slit-like shape, and a maximum length of the slit-like opening is larger than each of the length of the first side and the length of the second side of the seed crystal.

13. The method for producing a nitride semiconductor crystal according to claim 1, wherein the seed crystal is placed on a support for determining a position of the seed crystal, and a contact face between the seed crystal and the support is 1 mm or more away from the crystal growth face of the seed crystal.

14. The method for producing a nitride semiconductor crystal according to claim 1, wherein the seed crystal is selected from the group consisting of sapphire, SiC, ZnO and Group III nitride semiconductor.

15. The method for producing a nitride semiconductor crystal according to claim 1, wherein the nitride semiconductor is Group III nitride semiconductor.

16. The method for producing a nitride semiconductor crystal according to claim 1, wherein the nitride semiconductor is GaN semiconductor.

17. The method for producing a nitride semiconductor crystal according to claim 1, wherein a plate-like crystal having an area of the principal plane of 2,500 mm$^2$ or more is grown.

18. A method for producing a nitride semiconductor crystal without slicing the grown nitride semiconductor crystal, the method comprising growing a nitride semiconductor crystal on the seed crystal by conducting the crystal growth step according to claim 1, and separating the grown nitride semiconductor crystal from the seed crystal.

19. A nitride semiconductor crystal produced by the production method according to claim 1.

* * * * *